(12) United States Patent
Tagashira

(10) Patent No.: US 12,402,246 B2
(45) Date of Patent: Aug. 26, 2025

(54) CIRCUIT BOARD

(71) Applicant: SUMITOMO BAKELITE CO., LTD., Tokyo (JP)

(72) Inventor: Nobuo Tagashira, Tokyo (JP)

(73) Assignee: SUMITOMO BAKELITE CO., LTD., Tokyo (JP)

( * ) Notice: Subject to any disclaimer, the term of this patent is extended or adjusted under 35 U.S.C. 154(b) by 202 days.

(21) Appl. No.: 18/002,711

(22) PCT Filed: Jun. 1, 2021

(86) PCT No.: PCT/JP2021/020805
§ 371 (c)(1),
(2) Date: Dec. 21, 2022

(87) PCT Pub. No.: WO2021/261179
PCT Pub. Date: Dec. 30, 2021

(65) Prior Publication Data
US 2023/0247762 A1    Aug. 3, 2023

(30) Foreign Application Priority Data
Jun. 26, 2020 (JP) ................................. 2020-110347

(51) Int. Cl.
*H05K 1/02* (2006.01)
(52) U.S. Cl.
CPC ..... *H05K 1/0296* (2013.01); *H05K 2201/068* (2013.01)
(58) Field of Classification Search
CPC ........... H05K 1/0296; H05K 2201/068; H05K 2201/09272; H05K 1/056; H05K 1/0209; C04B 2237/366; C04B 2237/368; C04B 2237/407; C04B 37/021; H01L 23/142; H01L 23/49844; H01L 23/3735
See application file for complete search history.

(56) References Cited

U.S. PATENT DOCUMENTS 9,449,910 B2    9/2016   Obara
10,015,876 B2   7/2018   Yamamoto et al.
10,477,671 B2   11/2019  Maenaka et al.
(Continued)

FOREIGN PATENT DOCUMENTS

DE    102006014609 A1    10/2007
JP    H06-69611 A         3/1994
(Continued)

OTHER PUBLICATIONS

International Search Report dated Aug. 31, 2021, issued in counterpart International Application No. PCT/JP2021/020805 (2 pages).
(Continued)

*Primary Examiner* — Timothy J Thompson
*Assistant Examiner* — Paramita Ghosh
(74) *Attorney, Agent, or Firm* — WHDA, LLP

(57) ABSTRACT

A heat radiating substrate includes an insulating layer (11) (insulating substrate) and a circuit pattern (20) of a metal provided on the insulating layer (11) in direct contact with the insulating layer (11), in which a contour line of the circuit pattern (20) has a corner portion (27) that forms a curved line exhibiting a circular arc with a radius of 0.2 mm or more and 5 mm or less when viewed in a top view.

7 Claims, 4 Drawing Sheets

(56) References Cited

U.S. PATENT DOCUMENTS

| | | | |
|---|---|---|---|
| 10,720,375 B2 | 7/2020 | Mochizuki et al. | |
| 2005/0029666 A1* | 2/2005 | Kurihara | H01L 24/81 257/772 |
| 2006/0180341 A1* | 8/2006 | Kariya | H01L 23/49822 174/255 |
| 2016/0079152 A1 | 3/2016 | Obara | |
| 2017/0238409 A1 | 8/2017 | Yamamoto et al. | |
| 2018/0302976 A1 | 10/2018 | Maenaka et al. | |
| 2019/0341331 A1 | 11/2019 | Mochizuki et al. | |
| 2020/0388551 A1 | 12/2020 | Ashiba et al. | |
| 2021/0020557 A1 | 1/2021 | Sakaniwa et al. | |

FOREIGN PATENT DOCUMENTS

| | | | |
|---|---|---|---|
| JP | 2006-245436 A | 9/2006 | |
| JP | 2009-028993 A | 2/2009 | |
| JP | 2009-231249 A | 10/2009 | |
| JP | 2011-216619 A | 10/2011 | |
| JP | 2011-249711 A | 12/2011 | |
| JP | 2012-182344 A | 9/2012 | |
| JP | 2013-254922 A | 12/2013 | |
| JP | 2016-58595 A | 4/2016 | |
| JP | 2016-82108 A | 5/2016 | |
| JP | 2017-22265 A | 1/2017 | |
| JP | 2017-025186 A | 2/2017 | |
| JP | 2017-157722 A | 9/2017 | |
| JP | 2018-058250 A | 4/2018 | |
| JP | 2018-147934 A | 9/2018 | |
| WO | 2008-133182 A1 | 11/2008 | |
| WO | 2016-157552 A1 | 10/2016 | |
| WO | 2017-014237 A1 | 1/2017 | |
| WO | 2017/057553 A1 | 4/2017 | |
| WO | 2019/112048 A1 | 6/2019 | |
| WO | 2019/181428 A1 | 9/2019 | |
| WO | 2020-022129 A1 | 1/2020 | |

OTHER PUBLICATIONS

TSS Corporation High Heat-Resistant and High Thermal Conductivity Insulating Resin Substrate, Technologies & Smart Solutions, pp. 1, with partial translation, cited in JP Office Action dated Oct. 31, 2023. (2 pages).

"Nippon Rika Industries Corporation Basic Characteristics of Nippon Rika MCPCB", <https://www.mcpcb.jp/PDF/general-property.pdf>; Cited in JP Opposition Notice dated Nov. 18, 2022.

"Sumitomo Bakelite Co., Ltd. General properties of Epoxy Resin Copper-clad; Laminates Sumilite® ELC", https://www.sumibe.co.jp/product/hpp/circuitry/sumilite-elc-pwb/index.html; Cited in JP Opposition Notice dated Nov. 18, 2022.

"Etching Technologies for Printed Wiring Boards Truly Useful for Practical Use", p. 70-77, May 30, 2009 issue date, The Nikkan Kogyo Shimbun, Ltd. ; w/partial translation; Cited in JP Opposition Notice dated Nov. 18, 2022.

"High Thermal Conductive Epoxy Resin Composites with Controlled Higher Order Structures", Hitachi Chemical Technical Report,No. 53(Oct. 2009)p. 5-10; Cited in JP Opposition Notice dated Nov. 18, 2022.

"Risho Kogyo Corporation website," Risho Heat-Resistant Materials: Report; on Transient Heat Measurement Test Results, "Technical Report 92.; (https://www.risho.co.jp/rishonews/technical_report/tr92/technical_report.html),Apr. 10, 2013 Posted on Apr. 10, 2013,Risho Kogyo Co."; Cited in JP Opposition Notice dated Nov. 18, 2022.

Sumitomo Bakelite Co., Ltd. Press Release "High Thermal Conductivity Aluminum-Based Copper-Clad Laminates"Sumilite™ALC-1371"7W/mk Material Added to Lineup", September 12, 2013, Sumitomo Bakelite Co., Ltd. ; w/partial translation; Cited in JP Opposition Notice dated November 18, 2022.

The IGBT module, Mitsubishi Electric Corporation, which was already commercially available in Sep. 2017, CM100RX-24T, was inspected with an ultrasonic imaging device for internal circuit patterns. (2 pages).

"Storage Modulus, Loss Modulus and Loss Tangent", Mechanical Design & Analysis CO., vol. 2005-1, pp. 1-6, Dec. 2005, with partial translation, cited Written Opinion dated May 30, 2023. (8 pages).

Complex Elastic Modulus, kotobank web site, pp. 1,with partial translation, cited in Written Opinion dated May 30, 2023. (2 pages).

CM100TX-24T, "High Power Switching Use", Mitsubishi Electric, Sep. 2017, pp. 1-14, cited in Written Opinion dated May 30, 2023. (17 pages).

Test methods of copper-clad laminates for printed wiring boards, JIS, vol. 23, No. C-6481, p. 1-3, 20-29, and 40, 1996, with partial English translation. (22 pages).

* cited by examiner

CIRCUIT BOARD

TECHNICAL FIELD

The present invention relates to a circuit board.

BACKGROUND ART

Various developments have been made so far in circuit boards (also referred to as heat radiating substrates) having a heat radiation function. As this bind of technology, for example, a technology disclosed in Patent Document 1 is known. Patent Document 1 discloses a power module in which a semiconductor element is mounted on a support, such as a lead frame, and the support and a heat radiating plate connected to a heat sink are bonded to each other with an insulating resin layer.

RELATED DOCUMENT

Patent Document

Patent Document 1 Japanese Unexamined Patent Publication No. 2011-216619

SUMMARY OF THE INVENTION

Technical Problem

In recent years, better heat radiation properties are required for such a circuit board. Meanwhile, high heat radiation properties are required to be resistant to thermal stress because heat generated by a mounted electronic component or the like increases. That is, it is required that the circuit pattern is not peeled off and is in close contact with the resin substrate even in a case where the above thermal stress acts on the circuit pattern provided on the resin substrate.

The technology disclosed in Patent Document 1 cannot satisfy such a demand, and a new technology has been required.

The present invention has been made in view of such a situation, and an object of the present invention is to provide a technique of improving adhesiveness between a resin substrate and a metal circuit pattern in a case where the metal circuit pattern is provided on the resin substrate in direct contact with the resin substrate.

Solution To Problem

It is possible to provide a circuit board including:
an insulating substrate; and
a circuit pattern of a metal provided on the insulating substrate in direct contact with the insulating substrate, in which a contour line of the circuit pattern has a corner portion that forms a curved line exhibiting a circular arc with a radius of 0.2 mm or more and 5 mm or less when viewed in a top view.

Advantageous Effects Of Invention

According to the present invention, it is possible to provide a technique of improving adhesiveness between a resin substrate and a metal circuit pattern in a case where the metal circuit pattern is provided on the resin substrate in direct contact with the resin substrate.

DESCRIPTION OF EMBODIMENTS

Hereinafter, an embodiment of the present invention will be described with reference to the drawings.

<Overview of Heat Radiating Substrate>

Figure 1:
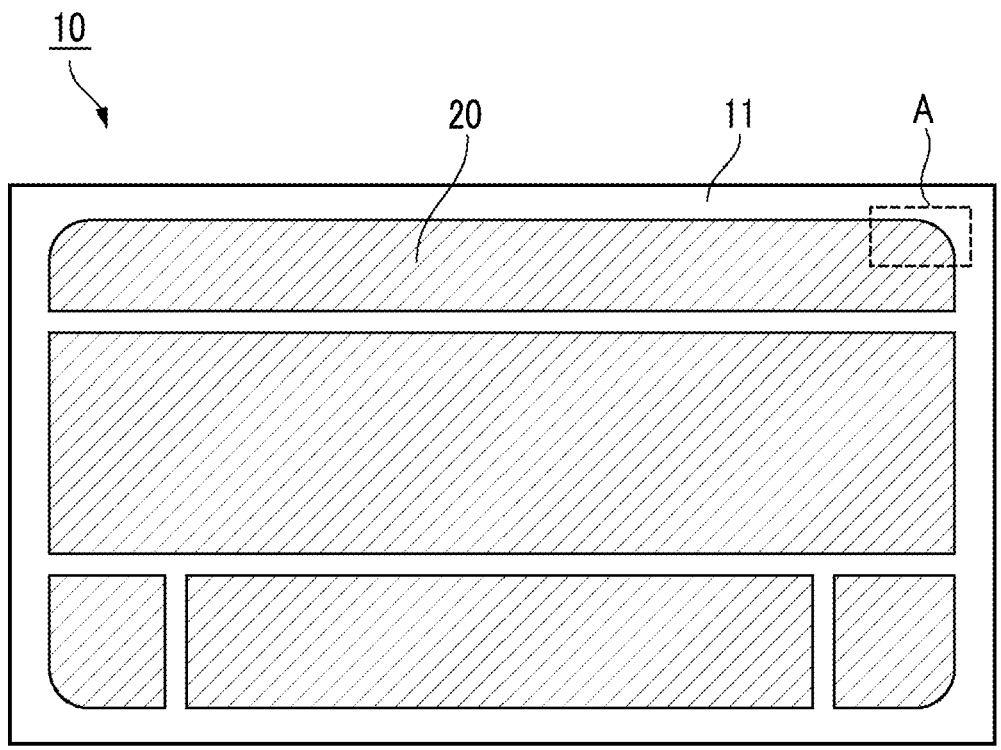
FIG. 1 is a plan view of a heat radiating substrate according to an embodiment.
Figure 2:
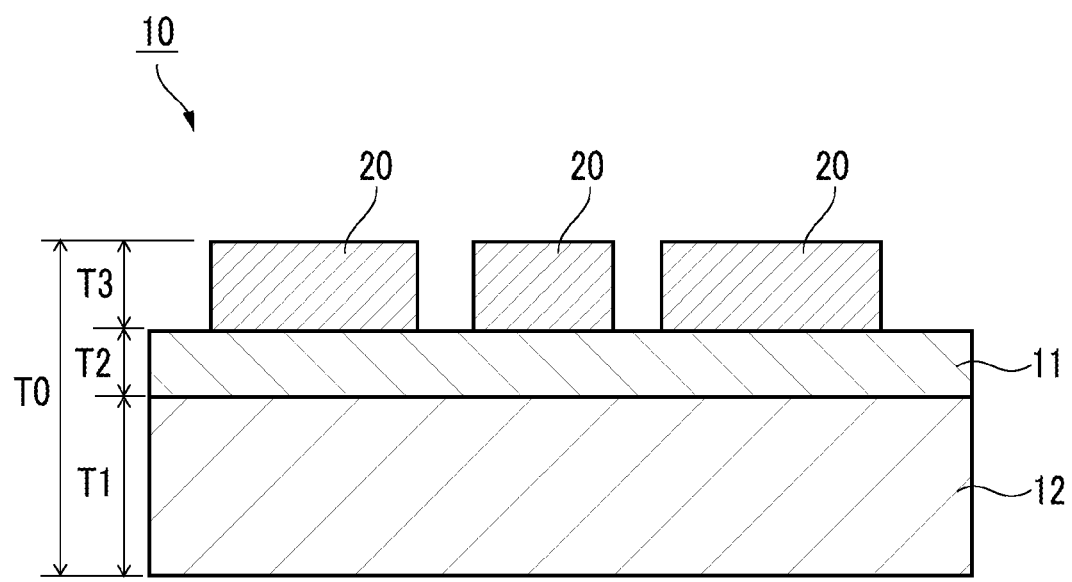
FIG. 2 is a cross-sectional view of the heat radiating substrate according to the embodiment.

FIG. 1 is a plan view of a heat radiating substrate 10. FIG. 2 is a partial cross-sectional view of the heat radiating substrate 10.

The heat radiating substrate 10 is a circuit board on which, for example, an electronic component of a heat-generating body is mounted, is composed of a metal substrate 12, an insulating layer 11 (insulating substrate), and a circuit pattern 20, and is a laminate (laminated body) laminated in this order from the bottom as shown in FIG. 2. The electronic component or the like is mounted on the circuit pattern 20.

A total thickness T0 of the heat radiating substrate 10 is not particularly limited, but is, for example, preferably 300 µm or more and 5000 µm or less and more preferably 1000 µm or more and 4000 µm or less.

<Metal Substrate 12>

The metal substrate 12 is a layer composed of a metal material, and in the present embodiment, the insulating layer 11 is formed on an upper surface thereof, and a heat radiating means (not shown), such as heat radiating fins and radiators, is appropriately attached to the lower surface thereof.

The metal material constituting the metal substrate 12 is not limited to a specific type, but for example, copper, a copper alloy, aluminum, an aluminum alloy, or the like can be used.

A thickness T1 of the metal substrate 12 is not particularly limited, but is the thickest among the elements (the insulating layer 11, the metal substrate 12, and the circuit pattern 20 laminated in the heat radiating substrate 10, and is preferably 10% to 90% with respect to the total thickness T0. The upper limit value of the thickness T1 of the metal substrate 12 is, for example, 20.0 mm or less and preferably 5.0 mm or less. The metal substrate 12 having the thickness T1 equal to or less than the upper limit value is used, whereby the heat radiating substrate 10 as a whole can be made thinner. Further, it is possible to improve the workability in routing, cutting, or the like of the heat radiating substrate 10.

The lower limit value of the thickness T1 of the metal substrate 12 is, for example, 0.1 mm or more, preferably 0.5 mm or more, and more preferably 1.0 mm or more. The metal substrate 12 having the lower limit value or more is used, whereby the heat radiation properties of the heat radiating substrate 10 as a whole can be improved.

<Insulating Layer 11>

The insulating layer 11 is a layer of a resin substrate mainly containing a resin material, and has a function of insulating the metal substrate 12 from the circuit pattern 20. As the insulating layer 11, a ceramic substrate an aluminum nitride substrate, a silicon nitride substrate, or the like) may be used instead of the resin substrate.

The resin material constituting the insulating layer 11 is not limited to a specific type, but examples thereof include a thermosetting resin, such as an epoxy resin, a phenol resin, a urea resin, a melamine resin, a polyester (unsaturated polyester) resin, or a polyimide resin, a silicone resin, and a polyurethane resin. As the resin material, one or a mixture of two or more of these resins can be used.

A filler composed of particles having electrical insulation properties and high thermal conductivity can also be mixed into the resin material constituting the insulating layer 11. Examples of the constituent material of the particles of the filler include metal oxides, such as alumina, and nitrides, such as boron nitride.

A thickness T2 of the insulating layer 11 is appropriately set according to the purpose, but the thickness T2 of the insulating layer 11 is preferably 40 µm or more and 400 µm or less from the viewpoint of more effectively transferring heat from the electronic component to the metal substrate 12 while improving the mechanical strength and heat resistance, and the thickness T2 of the insulating layer 11 is more preferably set to 80 µm or more and 300 µm or less from the viewpoint of further excellent balance between the heat radiation properties and the insulation properties in the entire heat radiating substrate 10. The thickness T2 of the insulating layer 11 is set to the above upper limit value or less, whereby it is possible to facilitate the transfer of heat from the electronic component to the metal substrate 12. In addition, the thickness T2 of the insulating layer 11 is set to the above lower limit value or more, whereby the insulating layer 11 can sufficiently alleviate the generation of thermal stress caused by a difference in coefficient of thermal expansion between the metal substrate 12 and the insulating layer 11. Further, the insulation properties of the heat radiating substrate 10 are improved.

The physical properties of the resin material forming the insulating layer 11 will be described.

The lower limit value of the glass transition temperature Tg of the resin material is, for example, 100° C. or higher, preferably 125° C. or higher, and more preferably 150° C. or higher. With this, the thermal decomposition of the cured product of the resin material (thermosetting resin composition) can be restrained. Further, the warpage of the insulating layer 11 (that is, the heat radiating substrate 10) can be restrained. As a result, it is possible to restrain the positional deviation of the electronic component or the like mounted on the circuit pattern 20 with respect to the heat radiating substrate 10, and it is possible to further enhance the connection reliability between the electronic component or the like and the heat radiating substrate 10. On the other hand, the upper limit value of the glass transition temperature Tg is not particularly limited, but may be, for example, 300° C. or less. The glass transition temperature of the insulating layer 11 can be measured on the basis of JIS C 6481.

The insulating layer 11 has high thermal conductivity. Specifically, the thermal conductivity of an insulating resin layer 102 in the thickness direction, which is measured by a laser flash method, is preferably 3.0 W/m·K or more and more preferably 5.0 W/m·K or more, with this, heat from the electronic component or the like mounted on the circuit pattern 20 can be easily transferred to the metal substrate 12 through the insulating layer 11.

An elastic modulus E of the insulating layer 11 at 25° C. is, for example, 1 GPa or more and 50 GPa or less. In addition, the lower limit value is preferably 5 GPa or more and more preferably 10 GPa or more from the viewpoint that the positional deviation of the electronic component with respect to the circuit board can be restrained as a result of increasing stiffness and reducing the warpage of the insulating resin layer 102, and the connection reliability between the electronic component and the circuit board can be further enhanced. The upper limit value is not particularly limited, but is 50 GPa or less as a realistic value thereof, as described above.

The above elastic modulus E can be measured with a dynamic viscoelasticity measuring device, and is a value of the elastic modulus at 25° C., for example, when measured at a temperature from −5° C. to 300° C., a frequency of 1 Hz, and a heating rate of 5° C. to 10° C./min with a tensile load applied to the insulating layer 11.

<Circuit Pattern 20>

The circuit pattern 20 is composed of a conductive metal material, and is electrically connected to an electronic component (LED or the like) of a heat-generating body by, for example, soldering. For example, copper can be suitably used as the metal material constituting the circuit pattern 20. With this, the circuit pattern 20 has a relatively small resistance value. At least a part of the circuit pattern 20 may be covered with a solder resist layer.

The circuit pattern 20 is formed, for example, by working a metal layer laminated on an insulating layer upper surface of the insulating layer 11 into a predetermined pattern through cutting and etching. The formation process will be described later in FIG. 4, but in the present embodiment, rolled copper is used as a metal layer 20A of FIG. 4.

The lower limit value of a thickness T3 of the circuit pattern 20 is, for example, 0.3 mm or more. In a case where the lower limit value is such a numerical value or more, it is possible to restrain the circuit pattern 20 from generating heat even in a use requiring a high current. Further, the upper limit value of the thickness of the circuit pattern 20 is, for example, 5.0 mm or less, preferably 4.0 mm or less, and more preferably 3.0 mm or less, in a case where the upper limit value is such a numerical value, the circuit workability can be improved, and the heat radiating substrate 10 as a whole can be made thinner.

<Detailed Shape of Circuit Pattern 20>

Figure 3:
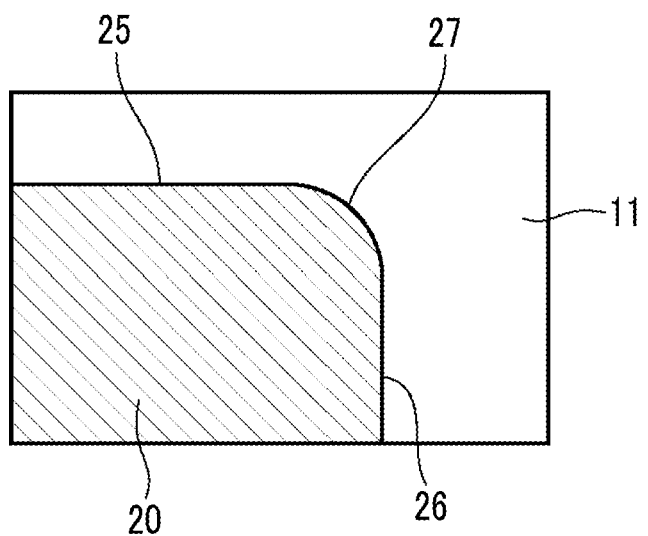
FIG. 3 is an enlarged view of a region A of FIG. 1 according to the embodiment.

FIG. 3 is an enlarged view of a region A of FIG. 1, and specifically shows an upper right corner portion 27 of the circuit pattern 20 of the heat radiating substrate 10.

A contour line of the circuit pattern 20 has the corner portion 27 that forms a curved line exhibiting a circular arc with a radius of 0.2 mm or more and 5 mm or less when viewed in a top view. That is, the circular arc of the corner portion 27 is a circular arc-shaped contour line that interconnects a first pattern contour line 25 extending horizontally in the drawing and a second pattern contour line 26 extending vertically in the drawing. In the present embodiment, the upper right corner portion 27 is shown as a curved line exhibiting the circular arc with the above radius, but four corner portions of the circuit pattern 20 are each preferably a curved line exhibiting the circular arc with the above radius.

The lower limit value of the radius of the circular arc exhibited by the corner portion 27 is preferably 0.5 mm or more. The upper limit value of the radius is not particularly limited, but is preferably 4 mm or less as a realistic value for mounting.

<Interface Between circuit Pattern 20 and insulating Layer 11>

The structure of the interface between the circuit pattern 20 and the insulating layer 11 in a case where the insulating layer 11 consists of a resin and the metal of the circuit pattern 20 consists of rolled copper will be described by focusing on the thermal stress generated therefrom.

The linear expansion coefficient at a temperature equal to or lower than the glass transition temperature of the resin of the insulating layer 11 is denoted by $\alpha_R$. The linear expansion coefficient $\alpha_R$ is, for example, 10 to 50 ppm/K. The thermal expansion coefficient can be measured using a linear expansion coefficient measuring method conforming to JIS Z2285:2003.

The linear expansion coefficient of the rolled copper of the circuit pattern 20 is denoted by $\alpha_{Cu}$. $\alpha_{Cu}$ is about 17 ppm/K.

The glass transition temperature of the resin of the insulating layer 11 is denoted by $T_g$, and the elastic modulus thereof is denoted by E. The glass transition temperature $T_g$ is, for example, 100° C. to 300° C. as described above. The elastic modulus E is, for example, 5 to 50 GPa.

In a case where the room temperature at the time of measurement is denoted by R, a stress index S calculated by Equation (1) is 1 MPa or more and 50 MPa or less. The stress index S indicates the stress factor when the rolled copper is provided on the resin, that is, the stress generated at the interface between the insulating layer 11 and the circuit pattern 20, and is preferably low. The upper limit value is more preferably 25 MPa or less and still more preferably 20 MPa or less. Although the lower limit value is not particularly limited, appropriate adhesiveness can be achieved even at 1 MPa or more, in a case where the contour line of the corner portion 27 exhibits a circular arc with a radius of 0.2 mm or more and 5 mm or less when viewed in a top view. In particular, in a case where the circuit pattern 20 is formed by etching after cutting with a router, as will be described in the following production process, the side surface part of the circuit pattern 20 has a small trailing-tailed shape at the interface part between the insulating layer 11 and the circuit pattern 20, and interfacial peeling does not easily occur. In particular, the desired interface adhesiveness can be achieved even in a case where the stress index S is 1 MPa or more.

$$S=|\alpha_R-\alpha_{Cu}|\times(T_g-R_T)\times E \quad \text{Equation (1)}$$

<Method of Producing Heat Radiating substrate 10>

Figure 4:
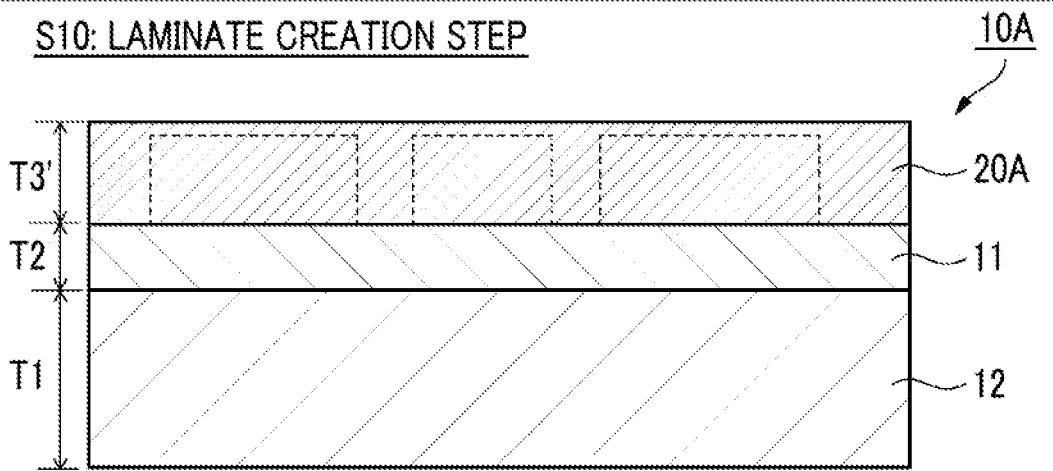
FIG. 4 is a chart showing a production step of the heat radiating substrate according to the embodiment.
Figure 4:
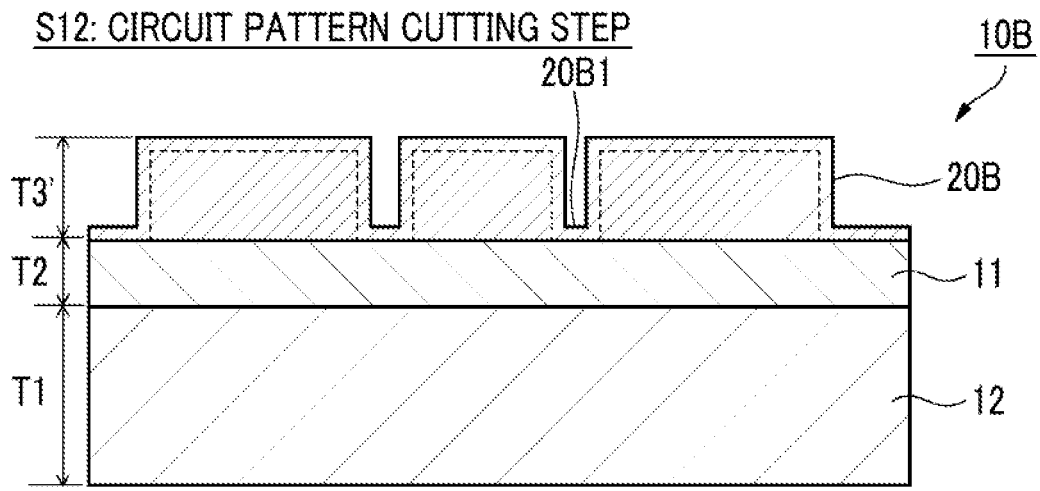
Figure 4:
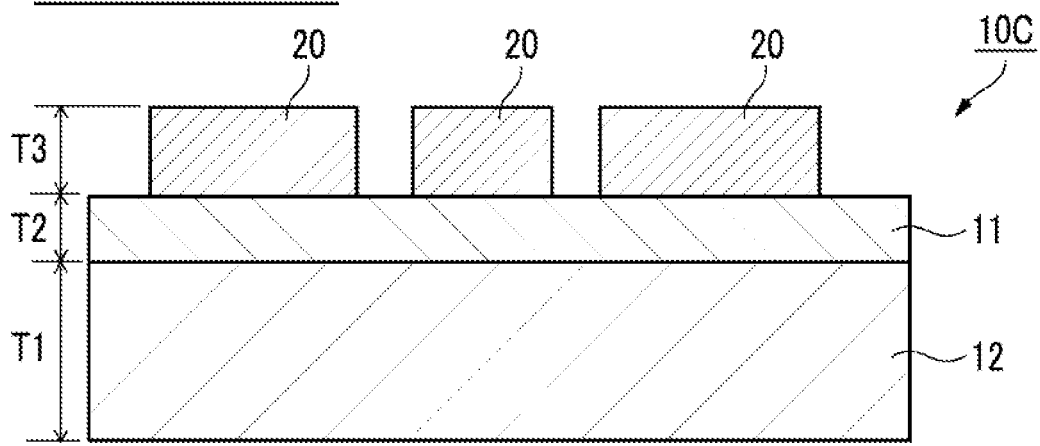

FIG. 4 is a chart showing the production process of the heat radiating substrate 10.

(S10: Laminate Producing Step (Laminated Body Preparing Step))

A laminate 10A in which the metal substrate 12, the insulating layer 11, and the metal layer 20A are laminated in this order from the bottom is prepared. The metal layer 20A is worked by the following steps to form the circuit pattern 20.

As the method of producing the laminate 10A, a known method can be used. For example, the metal substrate 12 is used as a carrier, and a liquid material (varnish-like material) as a constituent material of the insulating layer 11 is applied onto the metal substrate 12 having the thickness T1 by, for example, a spray method.

Then, the liquid material applied on the metal substrate 12 is dried by natural drying or forced drying. With this, the insulating layer 11 having the thickness T2 can be obtained. At this time, the insulating layer 11 may not be completely cured (so-called B stage state).

Next, the metal layer 20A having a thickness T3' is formed on the insulating layer 11. That is, the metal layer 20A (here, rolled copper) to be the circuit pattern 20 is laminated on the insulating layer upper surface of the insulating layer 11 by a hot press or the like. With this, the laminate 10A can be obtained. The thickness T3' of the metal layer 20A is set in consideration of an etching step, which will be described later.

(S12: Circuit Pattern Cutting Step)

Subsequently, the metal layer 20A of the above-described laminate 10A is cut so as to have a desired pattern by using a router. A provisional circuit pattern 20B is formed on the insulating layer 11 by leaving a metal layer (thin copper portion 20B1) having a predetermined thickness for a portion that is not a pattern. That is, there is a concern that the insulating layer 11 may be damaged in a case where all the patterns are formed by cutting. Therefore, the metal layer (thin copper portion 20B1) having the thickness is partially left as a margin. With this, a laminate 10B having the provisional circuit pattern 20B can be obtained. At this time, the corner portion 27 is also cut into a slightly larger circular arc in consideration of the next etching step (S14).

(S14: Etching Step)

Subsequently, the etching process is performed on the laminate 10B having the provisional circuit pattern 20B to melt the remaining metal layer (thin copper portion 20B1) and to form a desired pattern so that the final circuit pattern 20 can be obtained. With this, the heat radiating substrate 10 can be obtained. At this time, the corner portion 27 forms a circular arc with a radius of 0.2 mm or more and 5 mm or less when viewed in a top view. With this, the heat radiating substrate 10 can be obtained.

<Effect of Embodiment>

The features and effects of the embodiment are summarized as follows.

(1) The heat radiating substrate 10 includes:

the insulating layer 11 (insulating substrate); and the circuit pattern 20 of a metal provided on the insulating layer 11 in direct contact with the insulating layer 11, in which the contour line of the circuit pattern 20 has the corner portion 27 that forms a curved line exhibiting a circular arc with a radius of 0.2 mm or more and 5 mm or less when viewed in a top view. With this, the adhesiveness of the corner portion 27 can be improved.

(2) In the heat radiating substrate 10, the insulating layer 11 consists of a resin substrate.

(3) In the heat radiating substrate 10, the metal of the circuit pattern 20 consists of rolled copper.

(4) In the heat radiating substrate 10, the insulating layer 11 consists of a resin, and the metal of the circuit pattern 20 consists of rolled copper, and in a case where the linear expansion coefficient at a temperature equal to or lower than the glass transition temperature of the resin is denoted by $\alpha_R$, the linear expansion coefficient of the rolled copper (that is, the circuit pattern 20) is denoted by $\alpha_{Cu}$, the glass transition temperature of the resin is denoted by $T_g$, the elastic modulus of the resin is denoted by E, end the room temperature at the time of measurement is denoted by $R_T$, a stress index S calculated by Equation (1) is 1 MPa or more and 50 MPa or less.

$$S=|\alpha_R-\alpha_{Cu}|\times(T_g-R_T)\times E \quad \text{Equation (1)}$$

As described above, even in a case where the stress index S is 1 MPa or more and 50 MPa or less, good adhesiveness between the insulating layer 11 and the circuit pattern 20 can be realized.

Although the embodiment of the present invention has been described above, the embodiment is an example of the present invention, and various configurations other than the above embodiment can be adopted.

EXAMPLES

Figure 5A:
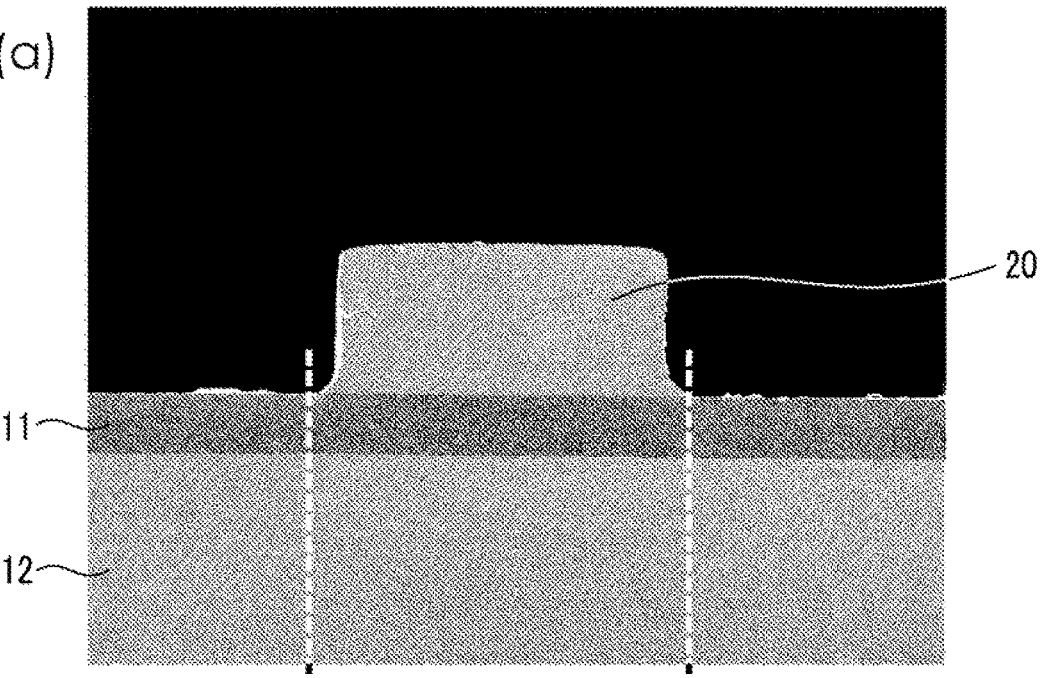
FIG. 5 (*a*) and FIG. 5 (*b*) are diagrams showing cross-sectional structures of circuit patterns of Example and Comparative Example according to the embodiment.

FIG. 5 (a) and FIG. 5 (b) show photographs of cross-sectional structures of Example and Comparative Example. FIG. 5 (a) is the heat radiating substrate 10 produced by forming the circuit pattern 20 by using the cutting and etching shown in the above-described embodiment (Example). FIG. 5 (b) is a heat radiating substrate produced by forming the circuit pattern 20 by using only conventional general etching (Comparative Example). Here, the photographs of the circuit cross-sections are vertically arranged so as to be comparable with each other. In these photographs, the width of the circuit pattern 20, more specifically, the width of a metal layer lower surface 22 (the interface with the insulating layer 11) is formed to be 1 mm.

Figure 5B:
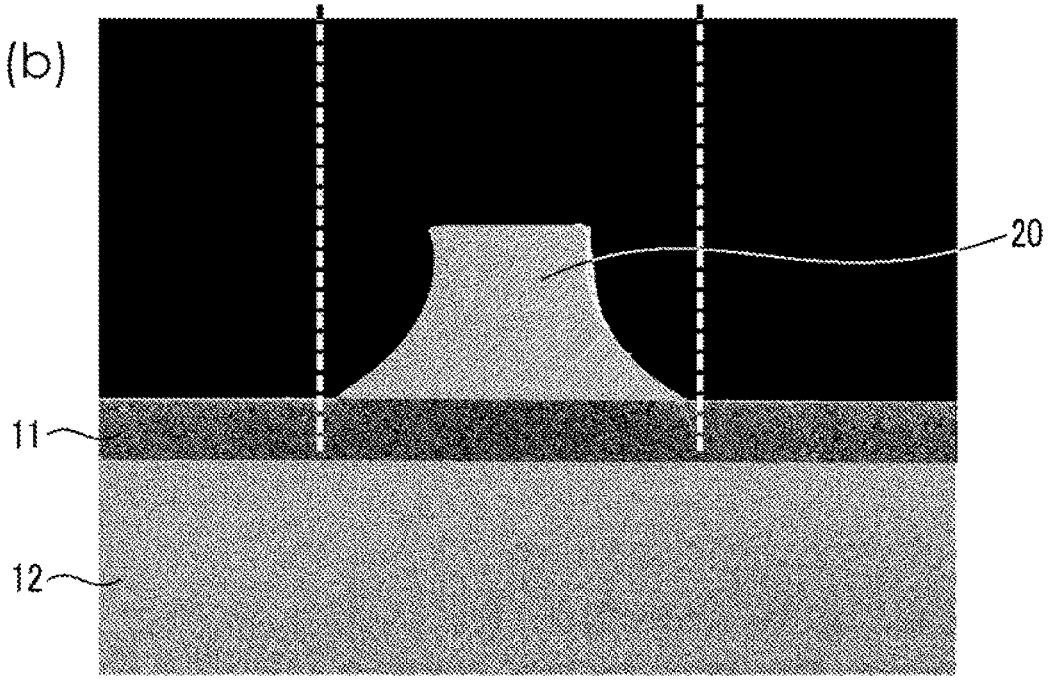

In Comparative Example shown in FIG. 5(b), the side surface portion has a trailing-tailed shape (substantially Mt. Fuji shape) as a whole, and the area of the upper surface of the circuit pattern 20 is narrowed. On the other hand, in Example shown in FIG. 5(a), the region of the side surface portion with the trailing-tailed shape is small, and most, of the region forms a straight line. In general, since a resin has a higher coefficient of linear expansion than that of a metal, thermal stress caused by the difference in coefficient of linear expansion between the resin and the metal increases in an environment involving temperature changes. As a result, interfacial peeling between the circuit pattern 20 and the insulating layer 11 may occur. In particular, the inter facial peeling is likely to occur in a region such as the corner portion 27. However, as shown in the present example, the side surface part of the circuit pattern 20 has a small trailing-tailed shape at the interface part between the insulating layer 11 and the circuit pattern 20, and the interfaciai peeling does not easily occur. In particular, in a case where the stress index S described above is satisfied, the adhesiveness of the interface can be greatly improved, and the interfaciai peeling can be restrained, as compared to the conventional structure.

This application claims priority based on Japanese Patent Application No. 2020-110347 filed on Jun. 26, 2020, all of its disclosures are incorporated herein.

REFERENCE SIGNS LIST 10 heat radiating substrate
10A, 10B laminate
10B laminate
11 insulating layer
12 metal substrate
20 circuit pattern
20A metal layer
20B provisional circuit pattern
20B1 thin copper portion
27 corner portion

The invention claimed is:
1. A circuit board comprising:
an insulating substrate; and
a circuit pattern of a metal provided on the insulating substrate in direct contact with the insulating substrate,
wherein a contour line of the circuit pattern has a corner portion that forms a curved line exhibiting a circular arc with a radius of 0.2 mm or more and 5 mm or less when viewed in a top view,
wherein the insulating substrate consists of a resin substrate,
wherein the thickness of the circuit pattern is between 0.3 mm and 5 mm,
wherein the insulating substrate consists of a resin, and the metal consists of rolled copper, and
wherein in a case where a linear expansion coefficient at a temperature equal to or lower than a glass transition temperature of the resin is denoted by $\alpha R$, a linear expansion coefficient of the rolled copper is denoted by $\alpha Cu$, the glass transition temperature of the resin is denoted by $T_g$, an elastic modulus of the resin is denoted by $E$, and a room temperature at the time of measurement is denoted by $RT$, a stress index S calculated by Equation (1) is 1 MPa or more and 10 MPa or less,

$$S=|\alpha_R-\alpha_{Cu}|\times(T_g-R_T)\times E \qquad \text{Equation (1)}.$$

2. The circuit board according to claim 1,
wherein the metal consists of rolled copper.
3. The circuit board according to claim 1,
wherein the elastic modulus of the resin is 1 GPa or more and 50 GPa or less at 25° C.
4. The circuit board according to claim 1,
wherein the glass transition temperature of the resin is between 100° C. and 300° C.
5. The circuit board according to claim 1,
wherein the resin includes at least one or more selected from the group consisting of epoxy resin, phenol resin, urea resin, melamine resin, polyester (unsaturated polyester) resin, polyimide resin, silicone resin and polyurethane resin.
6. The circuit board according to claim 1,
wherein the thickness of the insulating substrate is between 40 μm and 400 μm.
7. The circuit board according to claim 1,
wherein the insulating substrate has a metal substrate on the opposite side of the circuit pattern.

* * * * *